(12) United States Patent
Okazawa et al.

(10) Patent No.: US 6,746,875 B2
(45) Date of Patent: Jun. 8, 2004

(54) MAGNETIC MEMORY AND METHOD OF ITS MANUFACTURE

(75) Inventors: Takeshi Okazawa, Tokyo (JP); Kiyotaka Tsuji, Tokyo (JP); Kuniko Kikuta, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 10/271,007

(22) Filed: Oct. 15, 2002

(65) Prior Publication Data

US 2003/0073253 A1 Apr. 17, 2003

(30) Foreign Application Priority Data

Oct. 17, 2001 (JP) .......................................... 2001-319369

(51) Int. Cl.[7] ............................ H01L 21/00; H01L 29/82
(52) U.S. Cl. ............................ 438/3; 438/57; 257/421; 257/422; 365/157
(58) Field of Search .............................. 438/3, 48, 57; 257/421, 422; 365/157, 158

(56) References Cited

U.S. PATENT DOCUMENTS

| | | | | |
|---|---|---|---|---|
| 6,055,179 A | * | 4/2000 | Koganei et al. | ............ 365/158 |
| 6,097,579 A | * | 8/2000 | Gill | ........................... 360/324.2 |
| 6,219,212 B1 | * | 4/2001 | Gill et al. | ................. 360/324.2 |
| 6,351,408 B1 | * | 2/2002 | Schwarzl et al. | ............ 365/158 |
| 6,483,676 B2 | * | 11/2002 | Nakatani | .................. 360/324.2 |
| 6,576,969 B2 | * | 6/2003 | Tran et al. | ................... 257/421 |
| 6,579,729 B2 | * | 6/2003 | Goebel et al. | .................. 438/3 |

FOREIGN PATENT DOCUMENTS

| | | |
|---|---|---|
| JP | 2000-206220 | 7/2000 |
| JP | 2001-034919 | 2/2001 |
| WO | 00/57423 | 9/2000 |

* cited by examiner

Primary Examiner—Kevin M. Picardat
(74) Attorney, Agent, or Firm—Katten Muchin Zavis Rosenman

(57) ABSTRACT

A magnetic memory of a present invention is formed as below. The magnetic memory has a TMR film formed on a first conductive film, and a second conductive film with a flat top surface, having the same plane shape as that of the TMR film, formed on the TMR laminated film. A first insulating film having a flat top surface and the same height as the surface of the second conductive film is formed so as to surround the TMR film and the second conductive film. A third conductive film connected electrically to the second conductive film is formed on the first insulating film.

21 Claims, 11 Drawing Sheets

MAGNETIC MEMORY AND METHOD OF ITS MANUFACTURE

BACKGROUND OF THE INVENTION

1. Field of the Invention

The present invention relates to a magnetic memory and a method of its manufacture.

2. Description of a Related Art

In FIGS. 7(A)–(E) is shown a method of a magnetic memory of a related art. First, as shown in FIG. 7(A), a first Al conductive film 104 is formed on a $SiO_2$ insulating film 102 and patterned. Then, a tunnel magnetoresistive (TMR) film 106 is deposited on the patterned conductive film 104, and patterned.

Next, as shown in FIG. 7(B), a layer insulating film 110 is formed on the insulating film 102 so as to cover the first conductive film 104 and the TMR film 106.

Next, as shown in FIG. 7(C), a photoresist is coated on the layer insulating film 110 so as to form a resist mask 120 having a pattern for contact.

Next, as shown in FIG. 7(D), the layer insulating film 110 is etched to form a contact hole so as to expose a part of the surface of the TMR film 106.

Next, as shown in FIG. 7(E), an Al wiring layer 108 is deposited. In this case, the wiring layer 108 is formed also on the inner face of the contact hole, so that the wiring on the layer insulating film 110 and an upper electrode of the TMR film 106 are connected electrically.

As described in the above, in such technique, the upper Al wiring layer is formed after the layer insulating film on the TMR film is removed by means of a dry etching that uses the patterned resist film as a mask, thereby establishing contact to the top part of the TMR film.

However, in the above process, the shape of the contact hole is determined by the patterning of the resist film. Moreover, a margin for mismatch between the TMR film and the contact hole is required to be secured in the process. As a result, there is a problem in that the contact between the top part of the TMR film and the upper wiring was not assured in a self-aligned manner, which was a stumbling block in advance toward refinement of the device.

Moreover, the thickness of the wiring layer in the cross-section of the contact hole is decreased due to incomplete filling of the contact hole in the formation process of the upper wiring layer. As a result, there are problems in that the sectional area of the upper wiring layer directly above the contact is reduced, and that the migration due to a writing current is increased.

Furthermore, in order to establish contact to the top part of the TMR film, it is necessary to remove the layer insulating film as deep as to the top part of the TMR film by means of plasma etching that uses the patterned resist film as a mask. As a result, there is a problem in that the yield of the TMR film is lowered due to the damage to the TMR film caused by the plasma etching.

In conjunction with the above description, a magnetic field detection element is disclosed in Japanese Patent Applications Laid Open, No. 2000-206220. In this citation, the magnetic field detection element is equipped with a perovskite type conductive oxide magnetic material electrode, a ferromagnetic metal electrode and an insulating film. The insulating film is disposed between the two electrodes, and detects a tunneling current. Moreover, the insulating film has a sufficient thickness which can shield off the exchange magnetic coupling between the two electrodes.

Furthermore, a tunnel magnetoresistive head is disclosed in Japanese Patent Applications Laid Open, No. 2001-34919. In this citation, the tunnel magnetoresistive head has a tunnel multilayer film obtained by laminating a tunnel barrier layer, a ferromagnetic free layer formed so as to sandwich the tunnel barrier layer, and a ferromagnetic pinned layer. In this head, a tunnel barrier layer and a nonmagnetic metal protective layer are formed sequentially on the ferromagnetic pinned layer. A side insulating layer is formed on both sides of the laminate that includes the ferromagnetic pinned layer, the tunnel barrier layer and the nonmagnetic metal protective layer. The surface of the nonmagnetic metal protective layer is cleaned, and a ferromagnetic free layer is formed so as to oppose the ferromagnetic pinned layer via the treated surface of the protective layer.

BRIEF SUMMARY OF THE INVENTION

It is an object of the present invention to provide a magnetic memory and its method of manufacture by which the contact film between the TMR laminated film and the upper wiring can be formed in self-aligned fashion.

It is another object of the invention to provide a magnetic memory and its method of manufacture by which plasma damage to the TMR laminated film due to the etching of the layer insulating film can be eliminated.

It is another object of the invention to provide a magnetic memory and its method of manufacture by which reliability in a data writing current to the TMR laminated film can be enhanced.

It is another object of the invention to provide a magnetic memory and its method of manufacture by which the data writing current to the TMR laminated film can be reduced.

It is another object of the invention to provide a magnetic memory and its method of manufacture by which the line width of the wiring and the space between the wirings can be reduced so as to achieve the high density of the device.

According to a viewpoint of the present invention, the magnetic memory is equipped with a TMR laminated film formed on a first conductive film, and a second conductive film, formed on the TMR laminated film, having the same plane shape as the TMR laminated film.

Here, in the magnetic memory of this invention, the second conductive film has a flat surface. Moreover, the magnetic memory according to this invention may further be equipped with a first insulating film, formed so as to surround the TMR laminated film and the second conductive film, having a flat surface with the same height as the surface of the second conductive film, and a third conductive film, formed on the first insulating film, electrically connected to the second conductive film.

Moreover, from another viewpoint of this invention, the magnetic memory is equipped with a plurality of transistors formed in a matrix form on a substrate, first layer insulating films formed so as to cover the plurality of the transistors, a plurality of first conductive films formed on the plurality of transistors so as to expose only their top faces from the first layer insulating films, where respective films of the plurality of the first layer insulating films are connected to either one of the drain and the source of a plurality of the transistors of the corresponding columns, a plurality of magnetic memory elements formed on respective films of the plurality of the first layer insulating films, where respective elements of the plurality of the magnetic memory elements have TMR laminated films sandwiched between the corresponding films of the plurality of the first layer insulating films and the second conductive film, a second layer insulating film formed on the first layer insulating films with the same height as the height of the uppermost layer film so as to cover the plurality of the first layer insulating films, and so as to expose the top faces of the uppermost layer films of the plurality of the magnetic memory elements, and a plurality of third layer insulating films formed on the second layer insulating film, where respective films of the plurality of the third layer insulating films are connected electrically to the uppermost layer films of respective columns of the plurality of the magnetic memory elements.

From another viewpoint of the invention, the manufacturing method of the magnetic memory is equipped with a first step of laminating sequentially a first conductive layer, a TMR laminated layer, a second conductive layer and a soft magnetic layer on a first insulating film, a second step of forming a first hard mask by patterning the soft magnetic layer and the second conductive layer, a third step of forming a first conductive film by patterning the TMR laminated layer and the first conductive layer using the first hard mask, a fourth step of forming a soft magnetic film and a second conductive film as a second hard mask by patterning the patterned soft magnetic layer and the patterned second conductive layer, a fifth step of forming a TMR laminated film by patterning the patterned TMR laminated layer using the second hard mask, a sixth step of forming a second insulating film on the first insulating film so as to cover the first conductive film, the TMR laminated film, the second conductive film and the soft magnetic film, a seventh step of removing the second insulating film to the extent that the top face of the soft magnetic film is exposed, and an eighth step of forming a third conductive film on the second insulating film after removal so as to be connected electrically with the soft magnetic film.

From another viewpoint of the invention, the manufacturing method of the magnetic memory is equipped with a first step of laminating sequentially a TMR laminated layer and a conductive layer on a first conductive film, a second step of forming a second conductive film as a hard mask by patterning the conductive layer, a third step of forming a TMR laminated film by patterning the TMR laminated layer using the hard mask, a fourth step of forming an insulating film on the first conductive film so as to cover the first conductive film, the TMR laminated film and the second conductive film, a fifth step of removing the insulating film to the extent that the upper face of the second conductive film is exposed, and a sixth step of forming a third conductive film on the insulating film after the removal so as to connect it electrically to the second conductive film.

Moreover, from another viewpoint of the invention, the manufacturing method of the magnetic memory is equipped with a first step of laminating a TMR laminated layer, a conductive layer and a soft magnetic layer on a first conductive film, a second step of forming a soft magnetic film and a second conductive film as a hard mask by patterning the soft magnetic layer and the conductive layer, a third step of forming a TMR laminated film by patterning the TMR laminated layer, a fourth step of forming an insulating film on the first conductive film so as to cover the first conductive film, the TNR laminated film, the second conductive film and the soft magnetic film, a fifth step of removing the insulating film to the extent that the top face of the soft magnetic film is exposed, and a sixth step of forming a third conductive film on the insulating film after removal so as to connect it electrically to the soft magnetic film.

Moreover, from another viewpoint of the invention, the manufacturing method of the magnetic memory is equipped with a first step of sequentially laminating a TMR laminated layer and a conductive layer on a first conductive film, a second step of forming a second conductive film as a hard mask by patterning the conductive layer, and a third step of forming a TMR laminated film, with its topmost layer being the second conductive film, by patterning the TMR laminated layer.

As described in the above, in the present invention, the shape machining (milling process or etching process) of a tunnel magnetoresistive element (TMR laminated film) is carried out using a hard mask. In this way, the TMR laminated film can be formed in self-aligned fashion. Moreover, the thickness of the hard mask is set to be approximately equal to the thickness of the layer insulating film formed after the shape machining, and the contact to the upper part of the TMR laminated film is established through exposure of the hard mask by CMP. As a result, the contact can be established easily with high accuracy even if a refinement in the TMR laminated film is advanced. In addition, since the conventional method of etching the layer insulating film by means of a plasma is done away with, it is possible to eliminate the damage to the TMR laminated film by the plasma. Moreover, since the wiring above the TMR laminated film is formed on a plane, stability of the writing current and reliability of the wiring can be enhanced. Besides, it is possible to reduce the current required for writing by inserting a soft magnetic film between the upper wiring and the TMR laminated film.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Referring to the accompanying drawings, the magnetic memory of the present invention will be described in detail next.

First, referring to FIG. 1(H), the structure of the magnetic memory according to the first embodiment of the invention will be described. FIG. 2 is a top view showing of the magnetic memory shown in FIG. 1(H).

Figure 1A:
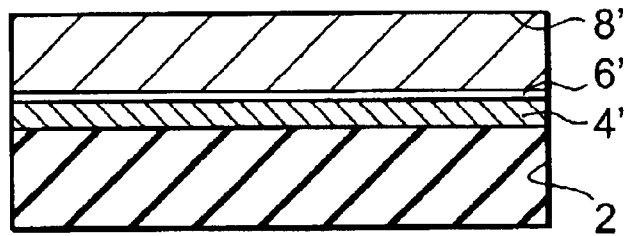
FIGS. 1(A) to 1(H) are sectional views showing the manufacturing method of the magnetic memory according to a first embodiment of the present invention.
Figure 1B:
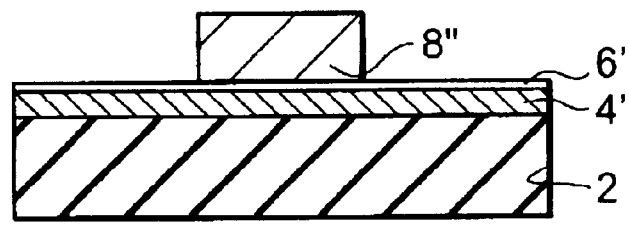
Figure 1C:
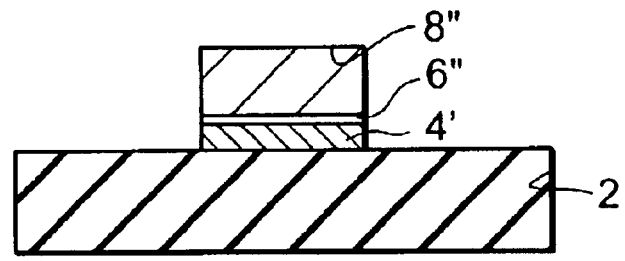
Figure 1D:
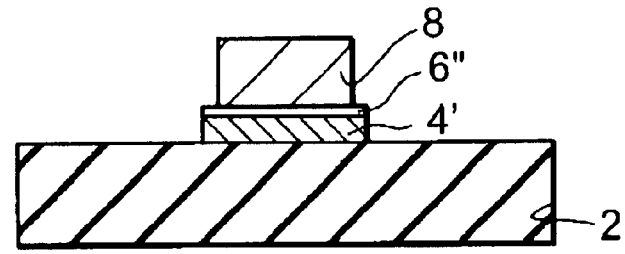
Figure 1E:
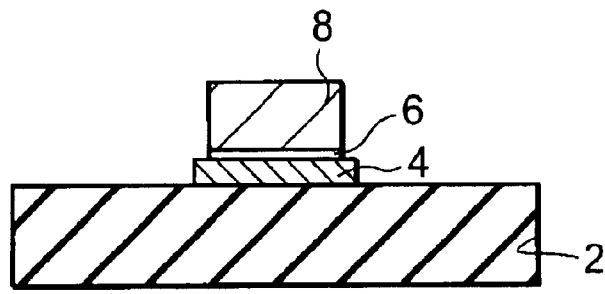
Figure 1F:
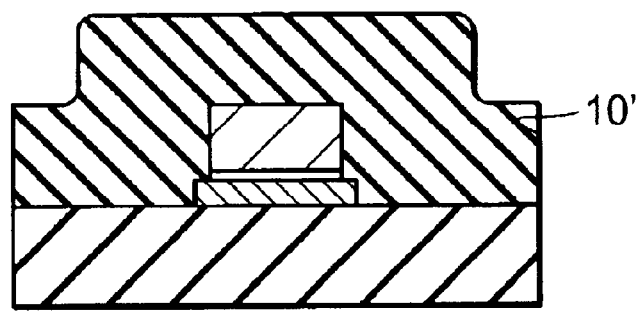
Figure 1G:
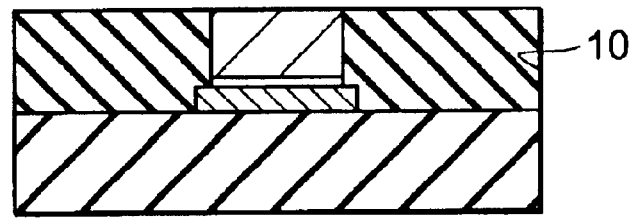
Figure 1H:
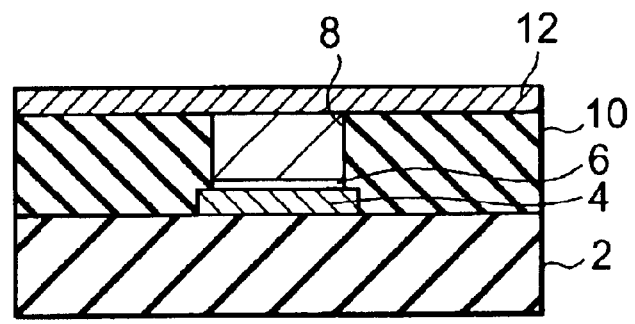
Figure 2:
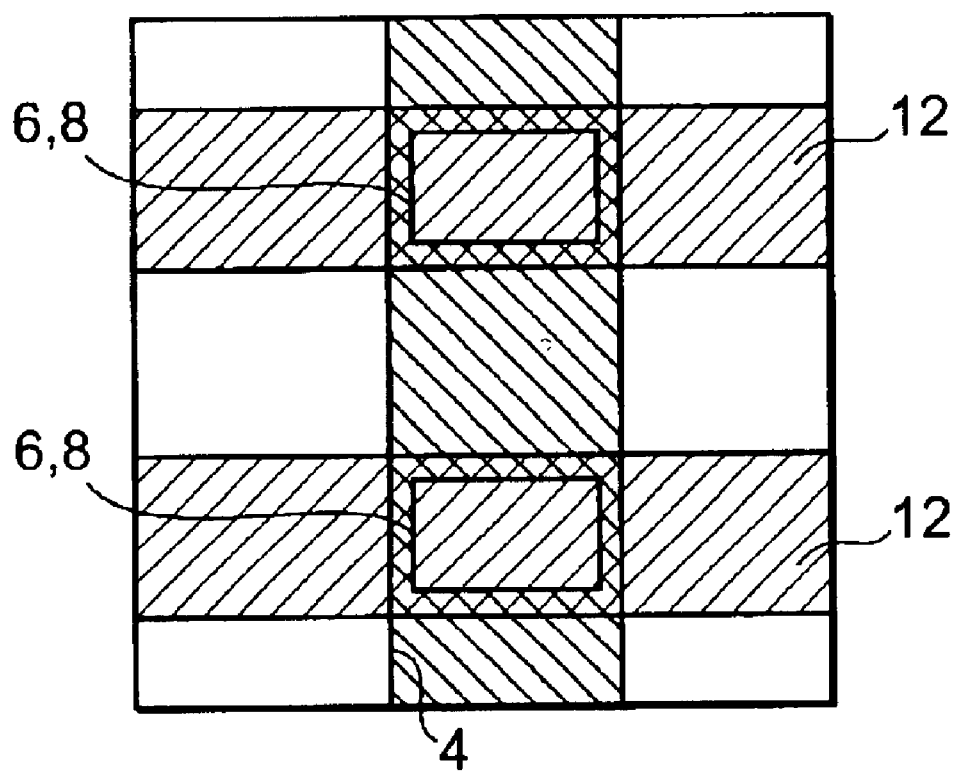
FIG. 2 is a top view showing of the magnetic memory according to the first embodiment of the invention.

In FIG. 1(H), a first conductive film 4 is formed on a part of a first insulating film 2. As the material for the first insulating film 2, $SiO_2$, $SiN_x$, PSG, BPSG, or the like is made use of. When a silicon substrate is used below the insulating film 2, the first insulating film is required only to have a thickness that ensures sufficient insulation between the first conductive film 4 and the Si substrate, which is set normally 200 nm or more.

Since the first conductive film 4 serves as a lower wiring, it is preferable that its material is a conductive metal or a metallic compound. More specifically, it is preferable to be a metal with low specific resistance such as Al, Cu, AlSiCu, or the like. The thickness of the first conductive film 4 is preferable to be in the range of 200 to 800 nm in order to secure low wiring resistance and reliability against disconnection.

In the magnetic memory of the first embodiment, a TMR laminated film 6 is formed on a part of the first conductive film 4. The TMR laminated film 6 has a lamination structure, enumerated from the side closer to the insulating film 2, of a 1.5 nm Ta layer/2 nm NiFe layer/10 nm IrMn layer/3 nm CoFe layer 1.5 nm $Al_2O_3$ layer/5 nm NiFe layer/5 nm Ta layer. However, the structure is not limited to the one just mentioned, and materials and the thickness of each layer may be appropriately adjusted according to the target performance. Moreover, the TMR laminated film 6 may be formed on the entire surface, not only on a part, of the first conductive film 4.

On the TMR laminated film 6 a second conductive film 8 is formed so as to have a flat surface. The second conductive film 8 may have the same shape as the TMR laminated film 6. The second conductive film 8 has the same Size or shape in top view as the TMR film 6. The shape may be rectangle or oval. The position of the side surface of the second conductive film 8 coincides with the position of the side surface of the TMR film 6 in vertical direction. As the material for the second conductive film 8, it is preferable that it is a conductive metal or a metallic compound, or their laminated film. This is because a reduction in the resistance variation ratio may be caused if the resistance connected in series to the TMR laminated film is large. More specifically, a TiN film is preferable, though an Al film, a Ti film, a Ta/Al/Ta laminated film, and the like may also be used. When a TiN film is employed, the thickness of the second conductive film 8 is preferable to in the range of 200 to 600 nm. The reason for this being that if the thickness is less than 200 nm, it is not easy to secure a sufficient margin in polishing in a later process while if it is 600 nm or more, the distance between the TMR laminated film 4 and the upper wiring becomes large which brings about an increase in the writing current.

A second insulating film 10 is formed in the periphery of the first conductive film 4, the TMR laminated film 6 and the second conductive film 8 on the first insulating film 2. As the material for the second insulating film 10, use is made of $SiO_2$, though $SiN_x$, PSG, BPSG, or the like may also be used. The surface of the second insulating film 10 is flattened so as to have almost the same height as that of the surface of the second conductive film 8.

A third conductive film 12 is formed on the flattened surface of the second insulating film 10 and the second conductive film 8 so as to establish the electrical connection with the second conductive film 8. Since the third conductive film is served as an upper wiring, its material is preferable to be a metal or a metallic compound. More specifically, a metal film with low specific resistance such as an Al film, a Cu film, an AlSiCu film is preferable as the third conductive film. The thickness of the third conductive film is preferable to be in the range of 200 to 800 nm in order to secure the low wiring resistance and the reliability of the film.

Next, the manufacturing method of the magnetic memory according to the first embodiment of the invention will be described.

As shown in FIG. 1(A), a first conductive film 4', a TMR laminated film 6' and a second conductive film 8' are laminated in this order on the first insulating film 2. In this embodiment, the first insulating film 2 is a $SiO_2$ film with thickness of 200 nm or more. The first conductive film 4' is an Al film with thickness in the range of 200 to 800 nm. The TMR laminated film 6' has a lamination structure, from the side closer to the insulating film 2, of a 1.5 nm Ta layer/2 nm NiFe layer/10 nm IrMn layer/3 nm CoFe layer 1.5 nm $Al_2O_3$ layer/5 nm NiFe layer/5 nm Ta layer. The second conductive film 8' is a TiN film with a thickness of 200 to 600 nm.

Next, as shown in FIG. 1(B), a photoresist is coated on the laminated layer of the first conductive film 4', the TMR laminated film 6' and the second conductive film 8', and a resist mask for the lower wiring pattern is formed by photolithography. Then, the portions of the second conductive film 8' that are not covered with the resist mask are removed by etching. An etching method with high anisotropy is desirable in order to form the lower wiring pattern with high accuracy. More specifically, a reactive plasma etching using a mixed gas of chlorine and argon is employed. A sputtering method using ions, such as milling, may also be employed. Then, the resist is subjected to ashing by an oxygen plasma, or removed by means of organic chemicals.

Next, as shown in FIG. 1(C), the TMR laminated film 6' and the first conductive film 4' not covered with the second conductive film 8' are removed by using the second conductive film 8' as a hard mask. In order to form the lower wiring pattern with high accuracy, an etching method with high anisotropy is preferred. More specifically, milling is employed. This is because a reactive etching is complicated and difficult due to the fact that the TMR laminated film 6 is a lamination of thin films with different materials. When materials for which reactive etching is relatively easy to carry out are used for the first conductive film 4', reactive etching may of course be employed.

Next, as shown in FIG. 1(D), the photoresist is coated again, and a resist mask having a pattern for a TMR laminated film 6" on the second conductive film 8" is formed. The second conductive film 8" in the portions not covered with the resist mask is removed by etching. In order to form a pattern of the TMR laminated film 6" with high accuracy, an etching method with high anisotropy is preferable. More specifically, a reactive plasma etching using a mixed gas of chlorine and argon is employed. A sputtering method using ions, such as milling, may also be employed. Then, the resist is subjected to ashing by an oxygen plasma, or removed by means of organic chemicals.

Next, as shown in FIG. 1(E), the portions of the TMR laminated film 6" not covered with the second conductive film 8 is removed by using the second conductive film 8 as a hard mask. An etching method with high anisotropy is preferred, and more specifically, milling is employed. The reason for this is that reactive etching is complicated and difficult due to the fact that the TMR laminated film 6" is a lamination of thin films with different materials.

Next, as shown in FIG. 1(F), a layer insulating film 10' is deposited on the first insulating film 2 so as to cover the first conductive film 2, the TMR laminated film 6 and the second conductive film 8. A SiO₂ film is employed as the layer insulating film 10'. By the use of high density plasma CVD or the like, it is possible to form a layer insulating film with good coverage. The surface of the layer insulating film is flattened by polishing in a later process. For this reason, the layer insulating film 10' is formed thicker than the sum of the thickness of the first conductive film 2, the TMR laminated film 6 and the second conductive film 8. In the first embodiment, the layer insulating film is formed to have a thickness in the range of 500 to 800 nm.

Next, as shown in FIG. 1(G), the surface of the layer insulating film 10' is polished by subjecting it to a CMP to the extent that the upper part of the second conductive film 8 as a hard mask is exposed to the surface.

Next, as shown in FIG. 1(F), an Al wiring layer is deposited on the flattened surface. Then, the photoresist is coated, and a resist mask for an upper wiring pattern is formed. The portions of the Al wiring film not covered with the resist mask are removed by etching, and the third conductive film 12 is formed. After that, the resist is subjected to ashing by an oxygen plasma or removed by means of organic chemicals. In this way, the third conductive film 12 as the upper wiring is formed. The third conductive film 12 is connected electrically to the second conductive film 8.

According to the first embodiment of the invention, it is possible to form the second conductive film 8 as a contact between the TMR laminated film 6 and the third conductive film 12 in self-aligned fashion. Moreover, since no layer insulating film is used on the TMR laminated film, differing from the prior art as shown in FIGS. 7(A) to 7(E), plasma damage to the TMR laminated film at etching can be made nonexistent. Moreover, wiring reliability to the writing current into the TMR laminated film can be enhanced.

This is so because the hard mask at etching of the TMR laminated film is used as is as a contact or a plug between the TMR laminated film 6 and the upper wiring film 12. Moreover, it is so because of the formation of the contact 8, with exposure of the upper part of the hard mask, by CMP, without the need for plasma etching of the layer insulating film. Moreover, this is also due to the fact that sectional area of the Al upper wiring is not reduced even right above the contact.

Next, the manufacturing method of the magnetic memory according to a second embodiment of the invention will be described. The magnetic memory according to the second embodiment of the invention has the structure the same as that of the first embodiment. Thus only the formation of the TMR laminated film on the first conductive film will be described, and the method is applicable to both cases when the first conductive film is formed on the insulating film, and when it is formed in the insulating film as a groove wiring.

Figure 3A:
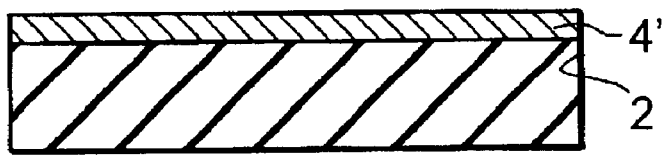
FIGS. 3(A) to 3(H) are sectional views showing the manufacturing method of the magnetic memory according to a second embodiment of the invention.

As shown in FIG. 3(A), a first conductive film 4' is formed on the first insulating film 2. In this embodiment, the first insulating film 2 is a SiO₂ film having a thickness of 200 nm or more. The first conductive film 4' is an Al film having a thickness in the range of 200 to 800 nm.

Figure 3B:
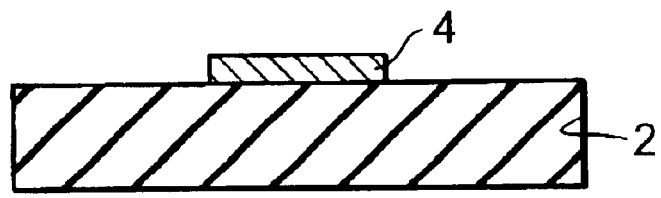

Next, as shown in FIG. 3(B), the photoresist is coated on the first conductive film 4', and a resist mask for a lower wiring pattern is formed by photolithography. Then, the portions of the first conductive film 4' not covered with the resist are removed by etching. In order to form a lower wiring pattern with high accuracy, it is preferable to adopt an etching method with high anisotropy. When a material to which reactive etching can be applied relatively easily, a reactive etching may also be employed.

Figure 3C:
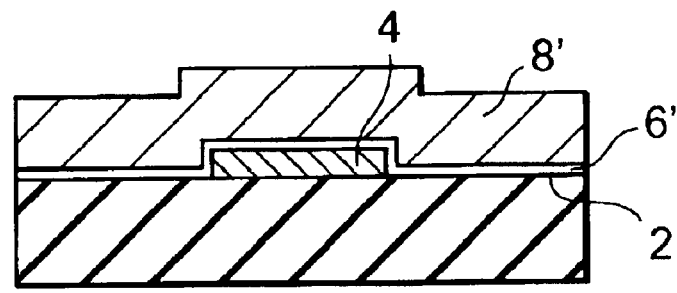

Next, as shown in FIG. 3(C), a TMR laminated film 6' and a second conductive film 8' are laminated in this order on the first conductive film 4. In this embodiment, the TMR laminated film 6' has a lamination structure, starting with the layer closer to the insulating film 2, of a 1.5 nm Ta layer/2 nm NiFe layer/10 nm IrMn layer/3 nm CoFe layer/1.5 nm Al₂O₃ layer/5 nm NiFe layer/5 nm Ta layer. The second conductive film 8' is a TiN layer having a thickness in the range of 200 to 600 nm.

Figure 3D:
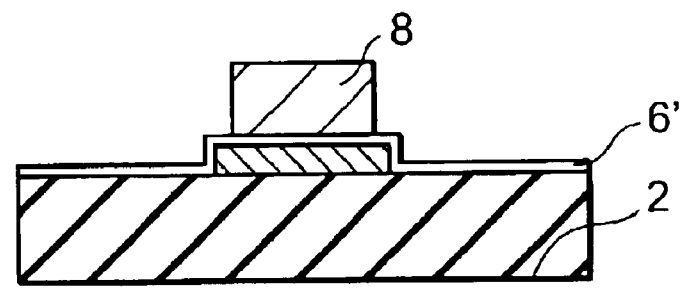

Next, as shown in FIG. 3(D), the photoresist is coated again, and a resist mask having a pattern for a TMR laminated film 6 is formed on the second conductive film 8. The second conductive film 8' not covered with the resist mask is removed by etching. In order to form a pattern for the TMR laminated film 6' with high accuracy, it is preferable to adopt an etching method with high anisotropy. More specifically, a reactive plasma etching using a mixed gas of chlorine and argon is employed. A sputtering method using ions, such as milling, may also be employed. Then, the resist is subjected to ashing, or removed by means of organic chemicals.

Figure 3E:
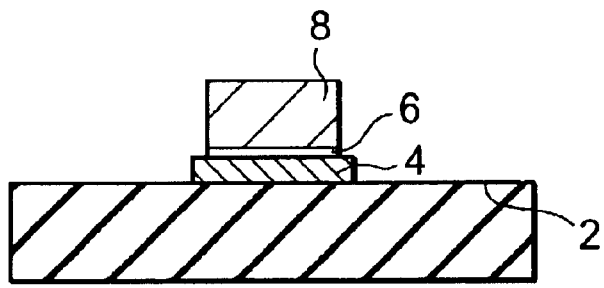

Next, as shown in FIG. 3(E), portions of the TMR laminated film 6' not covered with the second conductive film 8 are removed using the second conductive film 8 as a mask. For this operation, an etching method with high anisotropy is preferred, and more specifically, milling is employed. The choice of this method is decided for the reason that a reactive etching is complicated and difficult due to the fact that the TMR laminated film 6 is a lamination of thin films with different materials.

Figure 3F:
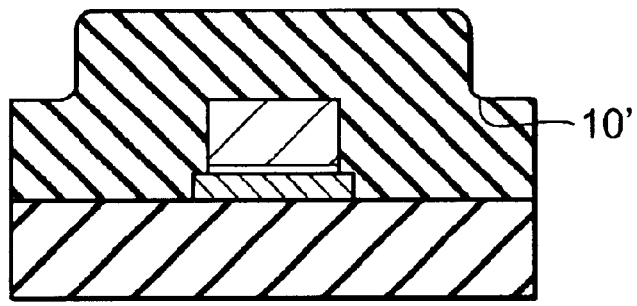

Next, as shown in FIG. 3(F), a layer insulating film 10' formed of an SiO₂ film is deposited on the first conductive film 2 so as to cover the first conductive film 2, the TMR laminated film 6 and the second conductive film 8. By the use of a high density plasma CVD or the like it is possible to form the layer insulating film with good coverage, and its surface is flattened by a polishing in a later process. For this reason, the layer insulating film is formed with a thickness larger than the sum of the thickness of the first conductive film 2, the TMR laminated film 6 and the second conductive film 8. In the second embodiment, the thickness of the layer insulating film is formed to have a value in the range of 500 to 800 nm.

Figure 3G:
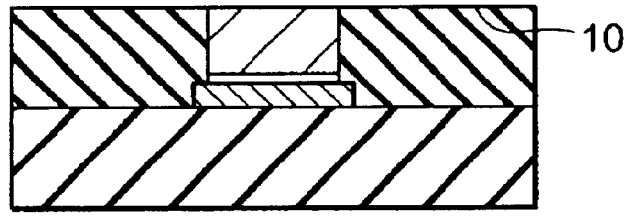

Next, as shown in FIG. 3(G), the surface of the second insulating film 10 is subjected to a CMP to the extent that the upper part of the second conductive film as a hard mask is exposed to the surface.

Figure 3H:
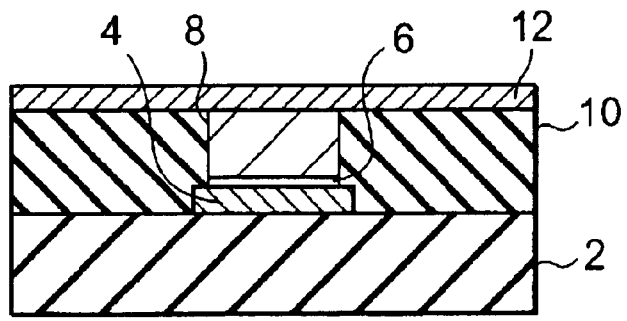

Next, as shown in FIG. 3(H), an Al wiring film is deposited on the flattened surface. Then, the photoresist is coated, and a resist mask for an upper wiring pattern is formed. The wiring film in the portions covered with the resist mask is removed by etching, and a third conductive film 12 is formed. Following that, the resist is subjected to ashing, or removed by means of organic chemicals. The third conductive film 12 is then connected electrically to the second conductive film 8.

Now, the magnetic memory according to a third embodiment of the invention will be described. In the third embodiment, a soft magnetic film 22 is formed on the second conductive film in the first embodiment. The soft magnetic film 22 is magnetized by the magnetic field generated when a current flows in the upper wiring (third conductive film 12). In this manner, a magnetic field is generated from the soft magnetic film. Although the direction of the magnetic field on the TMR laminated film generated by the wiring current and the direction of the magnetic field generated on the TMR laminated film generated by the soft magnetic film are mutually in the opposite directions, the magnitude of the magnetic field on the TMR laminated film is larger than that when the soft magnetic film is absent, if the magnetic susceptibility of the soft magnetic film is greater than unity. As a result, it is possible to reduce the wiring current required for changing the resistance of the TMR laminated film.

Next, the manufacturing method of the magnetic memory according to the third embodiment will be described. Since the, manufacturing method of the magnetic memory according to the third embodiment is basically the same as that of the first embodiment, only the points different from the first embodiment will be described in detail.

Figure 4A:
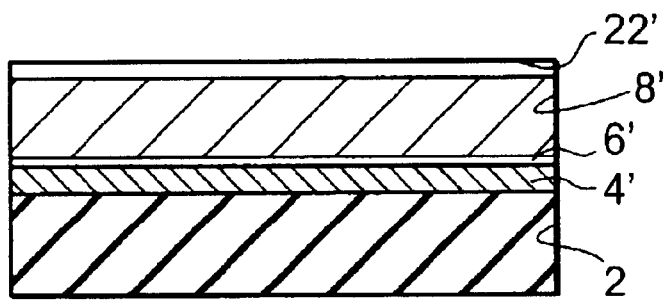
FIGS. 4(A) to 4(H) are sectional views showing the manufacturing method of the magnetic memory to a third embodiment of the invention.

As shown in FIG. 4(A), a first conductive film 4', a TMR laminated film 6', a second conductive film 8' and a soft magnetic film 22' are laminated in this order on a first insulating film 2.

Figure 4B:
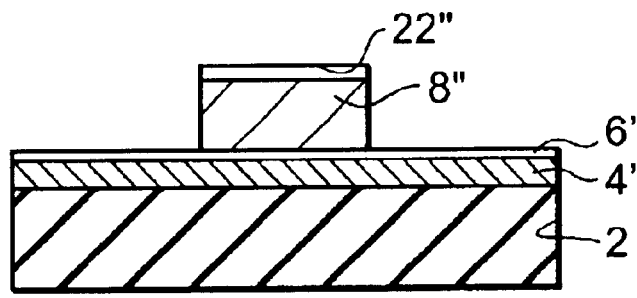

Next, as shown in FIG. 4(B), the photoresist is coated on a laminated film consisting of the first conductive film 4', the TMR laminated film 6', the second conductive film 8' and the soft magnetic film 22', and a resist mask for a lower wiring pattern is formed by photolithography. Then, portions of the soft magnetic film 22' and the second conductive film 8' that are not covered with the resist mask are removed by etching. In order to form a lower wiring pattern with high accuracy it is preferable to employ an etching method with high anisotropy. Following that, the resist is subjected to oxygen plasma ashing, or removed by means of organic chemicals.

Figure 4C:
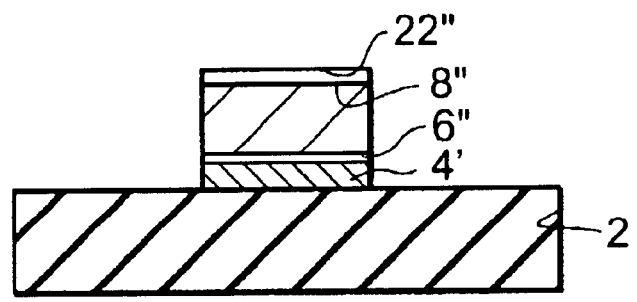

Next, as shown in FIG. 4(C), the TMR laminated film 6' and the first conductive film 4' not covered with the second conductive film 8" are removed by using the soft magnetic film 22" and the second conductive film 8" as a hard mask. In order to form a lower wiring pattern with high accuracy, an etching method with high anisotropy is preferable, and more specifically, milling is employed.

Figure 4D:
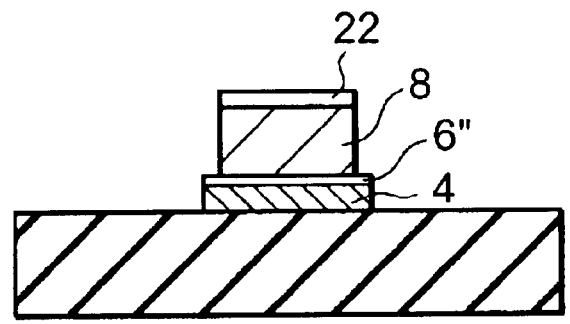

Next, as shown in FIG. 4(D), the photoresist is coated again and a resist mask having a pattern for the TMR laminated film is formed on the soft magnetic film 22". The portions of the soft magnetic film 22" and the second conductive film 8" that are not covered with the resist mask are removed by etching. In order to form a pattern for the TMR laminated film 6 with high accuracy, it is preferable to employ an etching method with high anisotropy. More specifically, a reactive plasma etching using a mixed gas of chlorine and argon is employed.

Figure 4E:
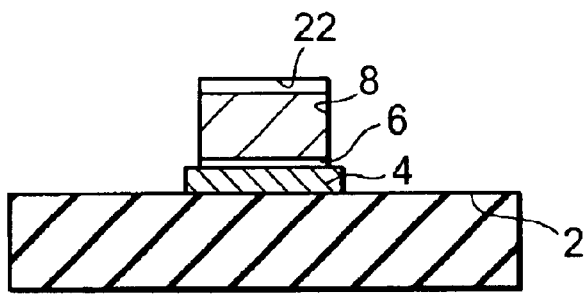

As shown in FIG. 4(E), the portions of the TMR laminated film 6" not covered with the second conductive film 8 are removed using the soft magnetic film 22 and the second conductive film 8 as a hard mask. It is preferable to employ an etching method with high anisotropy, and more specifically, milling is employed.

Figure 4F:
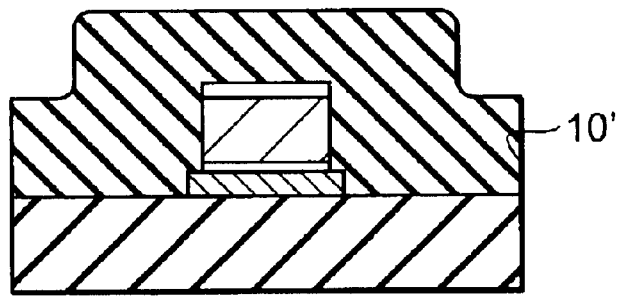

Next, as shown in FIG. 4(F), a layer insulating film 10' made of an $SiO_2$ film is deposited on the first insulating film 2 so as to cover the first conductive film 2, the TMR laminated film 6, the second conductive film 8 and the soft magnetic film 22. By adopting a high density plasma CVD or the like, it is possible to form a layer insulating film with good coverage. In the third embodiment, the layer insulating film is formed to have a thickness in the range of 500 to 800 nm.

Figure 4G:
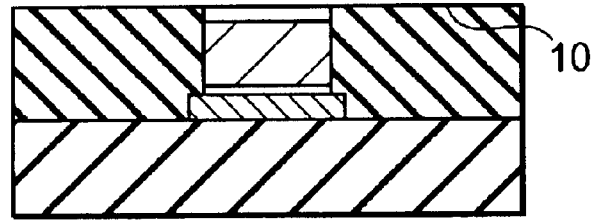

Next, as shown in FIG. 4(G), a second insulating film 10 is formed by subjecting the surface of the layer insulating film 10' to a CMP to the extent that the upper part of the second conductive film 8 as a hard mask is exposed to the surface.

Figure 4H:
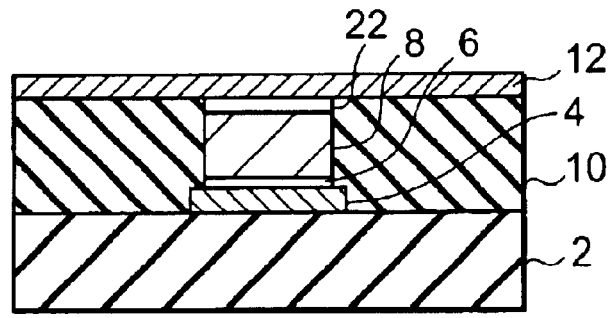

Next, as shown in FIG. 4(H), an Al wiring layer is deposited on the flattened surface. Then, the photoresist is coated, and a resist mask for an upper wiring pattern is formed. A third conductive film 12 is formed by etching through removal of the portions of the Al wiring film that are not covered with the resist mask. Following that, the resist is subjected to ashing, or removed by means of organic chemicals. In this manner, the third conductive film 12 as the upper wirings is formed. The third conductive film 12 is connected electrically to the soft magnetic film 22.

Next, the magnetic memory according to a fourth embodiment of the invention will be described. Since the magnetic memory according to the fourth embodiment differs from the second embodiment only in the point that a soft magnetic film is added, as mentioned above, only the different points from the second embodiment will be described.

Figure 5A:
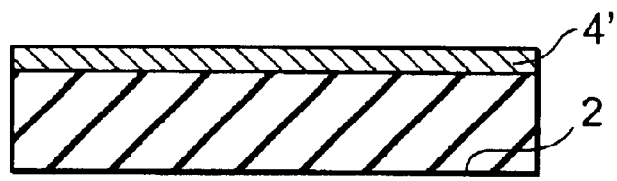
FIGS. 5(A) to 5(H) are sectional views showing the manufacturing method of the magnetic memory according to a fourth embodiment of the invention.

As shown in FIG. 5(A), a first conductive film 4' is deposited on a first insulating film 2.

Figure 5B:
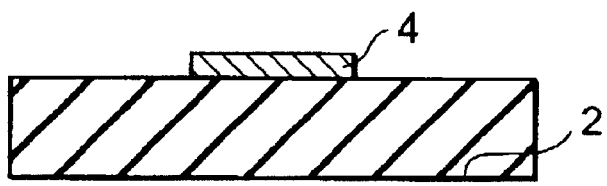

Next, as shown in FIG. 5(B), the photoresist is coated on the first conductive film 4', and a resist mask for a lower wiring pattern is formed by photolithography. Then, the portions of a first conductive film 4 that are ot covered with the resist are removed by etching.

Figure 5C:
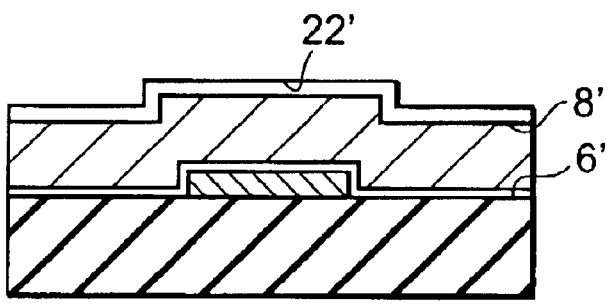

Next, as shown in FIG. 5(C), a TMR laminated film 6', a second conductive film 8' and a soft magnetic film 22' are laminated in this order on the first conductive film 4.

Figure 5D:
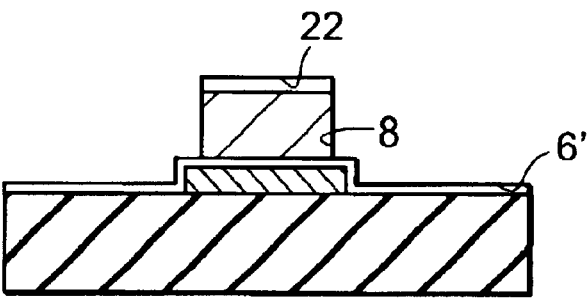

Next, as shown in FIG. 5(D), the photoresist is coated again, and a resist mask having a pattern for a TMR laminated film is formed on the second conductive film 8'. The portions of the soft magnetic film 22' and the second conductive film 8' that are not covered with the resist mask are removed by etching.

Figure 5E:
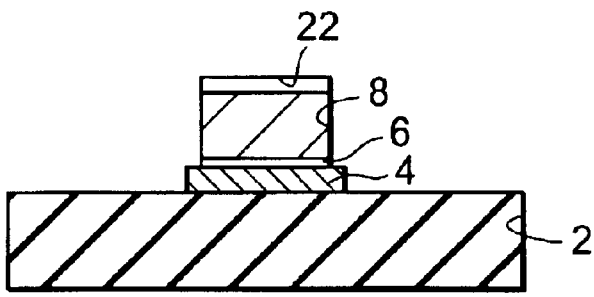

Next, as shown in FIG. 5(E), the portions of the TMR laminated film 6' that are not covered with a second conductive film 8 are removed using a soft magnetic film 22 and the second conductive film 8 as hard masks.

Figure 5F:
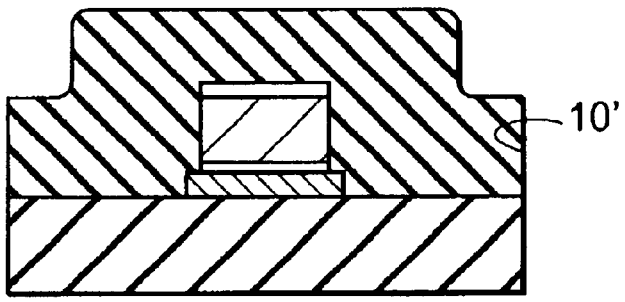

Next, as shown in FIG. 5(F), a layer insulating film 10' is deposited on the first insulating film 2 so as to cover the first conductive film 2, the TMR laminated film 6, the second conductive film 8 and the soft magnetic film 22.

Figure 5G:
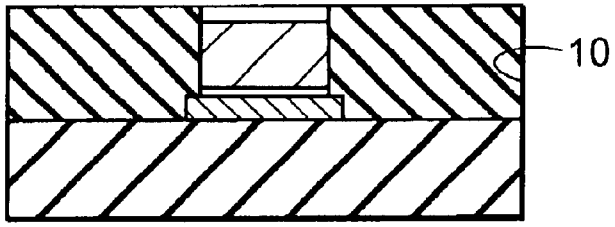

Next, as shown in FIG. 5(G), a second conductive film 10 is formed by subjecting the surface of the layer insulating film to a CMP to the extent that the upper part of the soft magnetic film 22 as the uppermost layer of the hard mask is exposed to the surface.

Figure 5H:
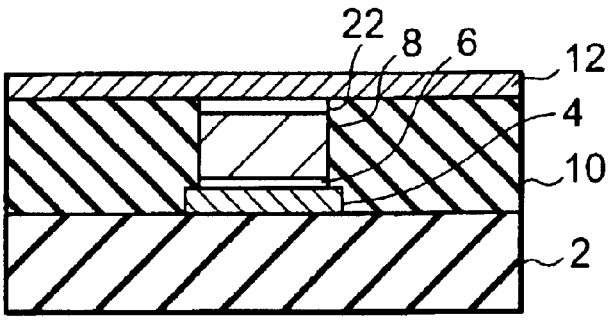

Next, as shown in FIG. 5(H), an Al wiring film is deposited on the flattened surface. Then, the photoresist is coated, and a resist mask for an upper wiring pattern is formed.

A third conductive film 12 is formed by etching through removal of the portions of the wiring film not covered with the resist mask. Following that, the resist is subjected to ashing, or removed by means of organic chemicals. In this way, the third conductive film 12 is connected electrically to the soft magnetic film 22.

Next, the magnetic memory according to a fifth embodiment of the invention will be described.

In the magnetic memory according to the fifth embodiment of the invention, the TMR laminated film is driven by a transistor. Besides, the TMR laminated film is formed on a bit line (first conductive film) with groove wiring structure.

Figure 6A:
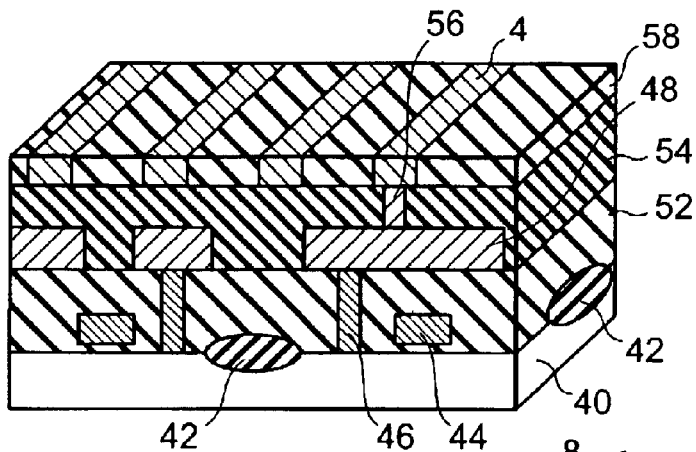
FIGS. 6(A) to 6(D) are sectional views showing the manufacturing method of the magnetic memory according to a fifth embodiment of the invention.

FIGS. 6(A) to 6 (D) illustrate the case where TMR elements are formed on a substrate with transistors formed on it. The topmost layers of wirings of the transistor portions are utilized as lower wirings 4. In this embodiment, film formations subsequent to that of TMR laminated films take place following the formation of the lower wirings as groove wirings. For this reason, etching utilizing a resist mask starts with the etching of a TMR pattern. Since adoption of the groove wiring structure enables to eliminate the need for the alignment margins between the TMR laminated film and the wiring, it is possible to minimize the line width of the wirings and the space between the wirings, and achieve high density arrangement of the elements.

Next, the manufacturing method of the magnetic memory according to the fifth embodiment will be described.

First, as shown in FIG. 6(A), element isolation regions 42 are formed in order to form transistors in matrix form on a silicon substrate 40. A transistor 50 having a source, a drain and a gate is formed in each element isolation region 42. A layer insulating film 52 is formed so as to cover the transistors 50. A connection plug 46 reaching the source region and the drain region of each transistor through the layer insulating film 52 is formed. A wiring 48 connected to each plug 46 is formed on the layer insulating film 52. The transistor, the layer insulating film 52 and the connection plug 46 are formed according to the known method.

Next, a layer insulating film 54 is formed so as to cover the wirings 48. Here, it is preferable that the surface of the layer insulating film 54 is made flat by CMP. Then, a connection plug 56 reaching the wiring 48 by penetrating the layer insulating film 54 is formed. Owing to the presence of the wiring 48 it is possible to form the connection plug 56 at a position different from the connection plug 46.

Next, a layer insulating film 58 is formed on the layer insulating film 54. Then, the layer insulating film 58 is patterned into strip forms. In this case, the connection plug 56 is exposed. Then, a conductive layer for a first conductive film 4 is deposited on the patterned layer insulating film 58, and the conductive layer is polished by CMP so as to have the thickness of the conductive layer to be equal to the thickness of the layer insulating film 58. In this way, the first conductive film 4 serving as a bit line is formed having a groove wiring structure. Accordingly, the layer insulating film 58 and the first conductive film 4 have a flat surface. The first conductive film 4 is connected to the facing wiring 48 via the connection plug 56.

Figure 6B:
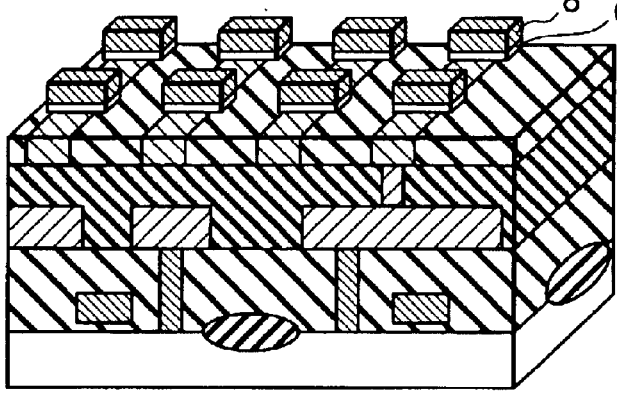

The processes thereafter are similar to those of the second embodiment. Namely, as shown in FIG. 6(B), a TMR laminated film and a second conductive film are deposited on the first conductive film 4 and the layer insulating film 58. Following that, a second conductive film is patterned above the transistor. In this manner, a second conductive film 8 as a hard mask is formed. The TMR laminated film is patterned using the hard mask.

Figure 6C:
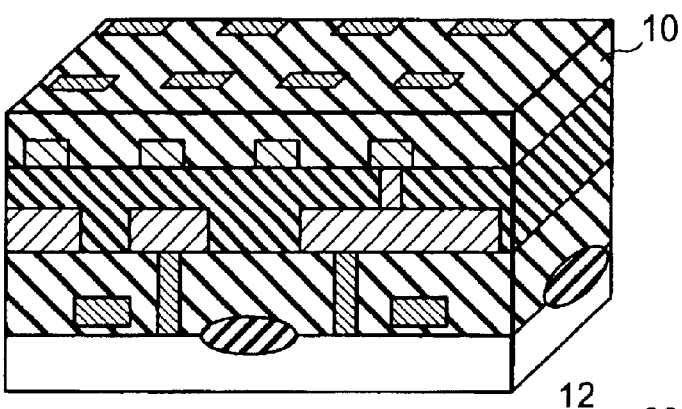

Next, as shown in FIG. 6(C), a layer insulating film is deposited. Then, the layer insulating film is subjected to a CMP to the extent that the surface of the second conductive film 8 is exposed. In this way, a second insulating film 10 is formed.

Figure 6D:
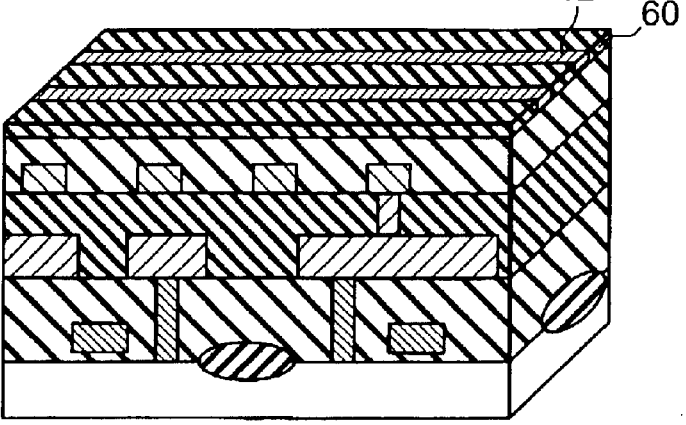
Figure 7A:
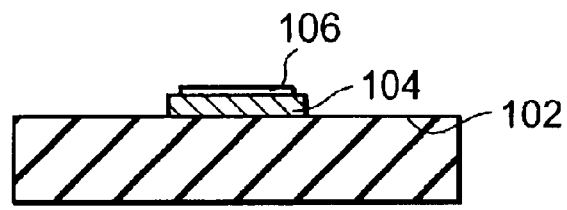
FIGS. 7(A) to 7(E) are sectional views showing the conventional manufacturing method of the magnetic memory.
Figure 7B:
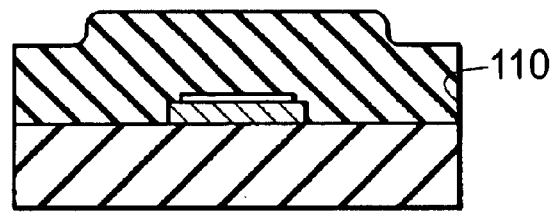
Figure 7C:
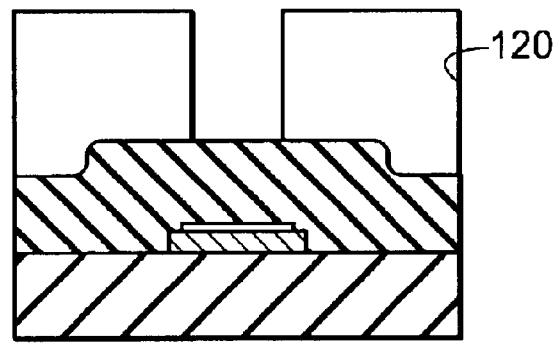
Figure 7D:
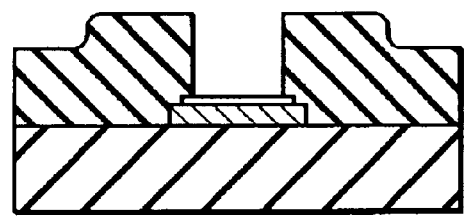
Figure 7E:
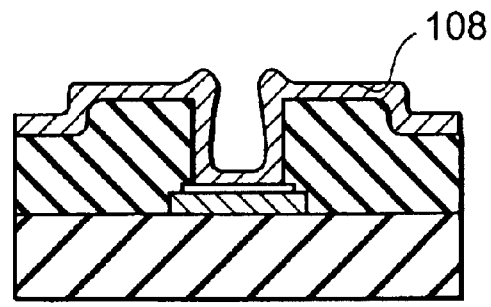

Next, as shown in FIG. 6(D), a layer insulating film is formed on the insulating film 10, and the layer insulating film is patterned in strip form. Then, a conductive layer for a third conductive film is deposited on the patterned layer insulating film, and the conductive layer is subjected to a CMP so as to have the thickness of the conductive layer equal to the thickness of the layer insulating film. In this manner, a third conductive film 12 serving as a word line is formed having a groove wiring structure. Then, an insulating film 60 is formed. Accordingly, the layer insulating film 60 and the third conductive film 12 have a flat surface. The third conductive film 12 is connected to the TMR laminated film 6 via the second conductive film 8 as the connection plug.

In the fifth embodiment, the third conductive film 12 is connected to the second conductive film 8. However, a soft magnetic film 22 may be formed on the second conductive film as mentioned in connection with the fourth embodiment.

Besides, each TMR element may be formed right above each transistor, or maybe formed at a position slightly shifted from directly above the transistor. When the TMR elements are formed right above the transistors, a magnetic memory with the highest density can be obtained.

As described in the above, according to the magnetic memory of the invention, the TMR laminated film can be formed in self-alignment with the contact plug, so that it is possible to design the TMR laminated film with minimum size.

Moreover, since the hard mask for the patterning of the TMR laminated films can also be used as the wirings, it is possible to enhance the reliability of the wirings.

Moreover, since no layer insulating film is formed on the TMR laminated film, it is possible to eliminate the plasma damage to the TMR laminated film.

Furthermore, when a soft magnetic film is formed on the second conductive film, it is possible to reduce the wiring current for writing.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of forming a magnetic memory, comprising:
   forming, on a first conductive film, a TMR layer and a second conductive layer in this order;
   forming a patterned second conductive film as a hard mask by patterning said second conductive layer;
   forming a patterned TMR film by patterning said TMR layer by using said hard mask.

2. The method as claimed in claim 1, said method further comprising:
   forming an insulating film to cover said first conductive film, said patterned TMR film and said patterned second conductive film;
   removing said insulating film until the top face of said patterned second conductive film is exposed; and
   forming a third conductive film on said insulating film so as to be connected electrically to said patterned second conductive film.

3. The method as claimed in claim 2, said method further comprising:
   forming a soft magnetic layer on said second conductive layer;
   forming a patterned soft magnetic film and said patterned second conductive film as said hard mask by patterning said soft magnetic layer and said second conductive layer.

4. The method as claimed in claim 2, wherein said insulating film is subjected to a chemical mechanical polishing.

5. The method as claimed in claim 1, wherein said first conductive film is patterned before said TMR layer is formed, and then said TMR layer is formed on the patterned first conductive film.

6. The method as claimed in claim 4, further comprising:

forming a transistor on a substrate;

forming a first insulating film to cover said transistor;

forming a plug which connects to said transistor by through said first insulating film; and forming said first conducive film on said first insulating film to connect to said plug.

7. The method as claimed in claim 1, wherein said second conductive film is patterned by using a first photoresist mask, said first photoresist mask is removed before said patterned TMR film is formed.

8. The method as claimed in claim 1, further comprising:

patterning said first conductive film by using said hard mask to form a patterned TMR film when said patterned TMR film is formed;

etching said hard mask to form a second hard mask; and patterning said patterned TMR film by using said second hard mask.

9. The method as claimed in claim 5, wherein said patterned first conductive film has a width different from that of said patterned second conductive film.

10. A magnetic memory comprising:

a tunnel magnetoresistive (TMR) film formed on a first conductive film; and a second conductive film formed on said TMR film, said second conductive film having the same plane shape as said TMR film, the width and length of said conductive film being different from the width and length of said TMR film.

11. The magnetic memory as claimed in claim 10, said memory further comprising;

a first insulating film which is formed so as to surround said TMR film and said second conductive film and has a flat top surface with the same height as a flat top surface of said second conductive film; and a third conductive film formed on said first insulating film and said second conductive film and connected electrically to said second conductive film.

12. The magnetic memory as claimed in claim 10, said memory further comprising a soft magnetic film formed on said second conductive film and having the same plane shape and the same size as said second conductive film.

13. The magnetic memory as claimed in claim 12, said memory further comprising;

a first insulating film which is formed so as to surround said TMR film, said second conductive film and said soft magnetic film and has a flat top surface with the same height as a flat top surface of said soft magnetic film; and a third conductive film formed on said first insulating film and said soft magnetic film and connected electrically to said soft magnetic film.

14. The magnetic memory as claimed in claim 10, wherein said first conductive film is connected to one of source and drain of a MOS transistor.

15. A magnetic memory comprising;

a plurality of transistors formed on a substrate in a matrix form;

a first layer insulating film formed so as to cover said plurality of transistors;

a plurality of first conductive films formed on said plurality of transistors so as to expose only their top faces from said first layer insulating film, respective films of said plurality of first conductive films being connected to one of drain and source of said plurality of transistors in the corresponding columns;

a plurality of magnetic memory elements formed on respective films of said plurality of first conductive films, respective elements of said plurality of magnetic memory elements having TMR films;

a plurality of second conductive films formed on respective films of said plurality of magnetic memory elements;

a second layer insulating film formed on said first layer insulating film so as to cover said plurality of first conductive films and so as to expose the top surface of said second conductive films, said second layer insulating film having a top surface with the same height as the top surface of said second conductive film; and a plurality of third conductive films formed on said second layer insulating film, respective films of said plurality of third conductive films being connected electrically to the said second films of respective columns of said plurality of magnetic memory elements, wherein each of said magnetic memory elements has a plane size which is different from a plane area overlapping one of said first conductive films and a corresponding one of said third conductive films.

16. The magnetic memory as claimed in claim 15, wherein magnetic memory element has a soft magnetic film connected to a corresponding one of said second conductive films.

17. A method of forming a magnetic memory, comprising:

forming a first conductive layer, a TMR layer and a second conductive layer in this order on a first insulating film; patterning said second conductive film to form a first hard mask; patterning said TMR layer by using said first hard mask.

18. The method as claimed in claim 17, said method further comprising:

patterning said first hard mask to form a second hard mask which is smaller than said first hard mask;

patterning said patterned TMR layer by using said second hard mask to form TMR cell layer;

forming a second insulating film on said first insulating film so as to cover said first conductive film, said TMR film and said second conductive film;

removing said second insulating film to expose the top face of said second conductive film; and forming a third conductive film on said second insulating film so as to be connected electrically to said second conductive film.

19. The method as claimed in claim 17, said method further comprising:

forming a soft magnetic layer after forming second conductive layer;

forming said first hard mask by patterning said soft magnetic layer and said second conductive layer.

20. The method as claimed in claim 19, wherein said second insulating film is subjected to a chemical mechanical polishing (CMP).

21. The method as claimed in claim 17, wherein said second conductive film is patterned by using a first photoresist mask, said first photoresist mask is removed before said TMR layer is patterned by using said first hard mask.

* * * * *